United States Patent
Yamane (10) Patent No.: US 7,240,256 B2
(45) Date of Patent: Jul. 3, 2007

(54) SEMICONDUCTOR MEMORY TEST APPARATUS AND METHOD FOR ADDRESS GENERATION FOR DEFECT ANALYSIS

(75) Inventor: Tomoyuki Yamane, Tokyo (JP)

(73) Assignee: Advantest Corp., Tokyo (JP)

( * ) Notice: Subject to any disclaimer, the term of this patent is extended or adjusted under 35 U.S.C. 154(b) by 588 days.

(21) Appl. No.: 10/477,782

(22) PCT Filed: May 16, 2002

(86) PCT No.: PCT/JP02/04736

§ 371 (c)(1),
(2), (4) Date: Nov. 12, 2003

(87) PCT Pub. No.: WO02/093583

PCT Pub. Date: Nov. 21, 2002

(65) Prior Publication Data

US 2004/0145933 A1    Jul. 29, 2004

(30) Foreign Application Priority Data

May 16, 2001  (JP) .............................. 2001-146891

(51) Int. Cl.
*G11C 29/04* (2006.01)
*G01R 31/3183* (2006.01)
(52) U.S. Cl. ...................... 714/723; 714/738
(58) Field of Classification Search ........ 714/718–723, 714/738, 739, 748; 365/200–201
See application file for complete search history.

(56) References Cited

U.S. PATENT DOCUMENTS 6,374,378 B1 * 4/2002 Takano et al. .............. 714/719
6,711,705 B1 * 3/2004 Yasui ......................... 714/723

FOREIGN PATENT DOCUMENTS

| JP | 405087881 A | * | 4/1993 |
| JP | 8-62302 | | 3/1996 |
| JP | 09147596 A | * | 6/1997 |
| JP | 11-273397 | | 10/1999 |

* cited by examiner

*Primary Examiner*—Cynthia Britt
(74) *Attorney, Agent, or Firm*—Maramatsu & Associates (57) ABSTRACT

There is disclosed a semiconductor memory test apparatus capable of easily generating an address to be input into a failure analysis memory for testing a memory device having a burst function which automatically generates addresses for banks therein. Each of registers corresponding to the banks of the memory device holds a line address of the corresponding bank. When a start address of one of the banks is input to the memory device, a line address of the same bank as the start address is read out from the register corresponding to the bank and output to a failure analysis memory together with the start address. Furthermore, during burst operation of the bank, the registers output the line address to the failure analysis memory together the same line address as the memory device generated by calculating the start address for each clock cycle.

11 Claims, 4 Drawing Sheets

SEMICONDUCTOR MEMORY TEST APPARATUS AND METHOD FOR ADDRESS GENERATION FOR DEFECT ANALYSIS

This case is a national stage application with priority based on International Application No. PCT/JP02/04736.

TECHNICAL FIELD

The present invention relates to a semiconductor memory test apparatus which tests a memory device such as an SDRAM (synchronous DRAM), and more particularly to a semiconductor memory test apparatus capable of easily generating an address to be inputted to a failure analysis memory in a test during an inter-bank interleave operation of a memory device having a plurality of banks, and a failure analysis address generator constituting the semiconductor memory test apparatus.

BACKGROUND ART

A semiconductor memory test apparatus inputs a test pattern signal to a memory device, and compares a response output signal from the memory device with an expected value pattern signal. Further, it detects a mismatch of a comparison result as a failure of the memory cell, and stores failure information (fail data) in a failure analysis memory. In the failure analysis memory, the same address space as that of the memory device is set, and failure information is stored at the same address as an address of a failure cell.

Meanwhile, in recent years, in a memory device such as an SDRAM (synchronous DRAM), an increase in data read/write speed is achieved by an operation in a burst mode. In the burst mode, when only a start address (first address) is given, subsequent addresses are sequentially automatically generated.

Therefore, in a test of the memory device which operates in the burst mode, only the start address is inputted to the memory device. On the contrary, not only the start address but also addresses which are automatically generated in the memory device must be inputted to the failure analysis memory. Thus, in a conventional semiconductor memory test apparatus, there are inputted the start address as well as addresses sequentially obtained by operating the start address in the burst period. As a result, the same address space as that of the memory device as a device under test can be set in the failure analysis memory.

An address generation operation in the conventional semiconductor memory test apparatus will now be described with reference to a timing chart of FIG. 4.

Figure 4:
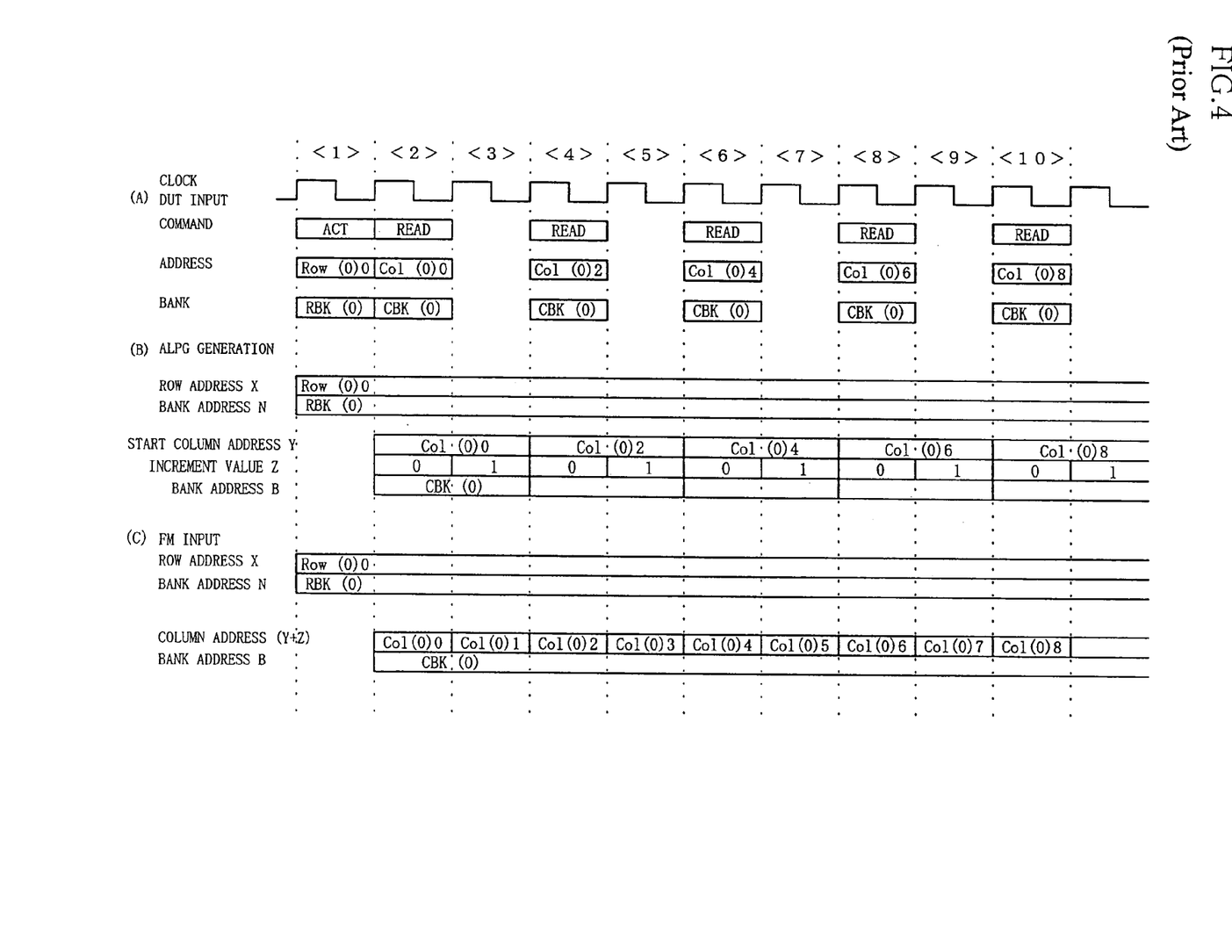
FIG. 4 is a timing chart illustrating an operation of a conventional semiconductor test apparatus.

FIG. 4 shows an example of a timing of address generation when testing an SDRAM which has a plurality of banks, operates with respect to row addresses in a burst mode and has burst length of "2".

(A) in FIG. 4 shows input timings of a command, an address and a bank address to a memory device under test (DUT). Furthermore, (B) in FIG. 4 shows generation timings of a row address (Row), a start column address (Col), an increment and a bank address in an address generator of a test pattern generator (ALPG). Moreover, (C) in FIG. 4 shows input timings of a row address (Row) and a column address (Col) as failure analysis addresses to a failure analysis memory (FM).

A description will now be given as to generation timings of addresses and the like in the test pattern generator indicated by (B) in FIG. 4, input timings of addresses and the like to the memory device indicated by (A) in FIG. 4, and input timings of addresses and the like to the failure analysis memory indicated by (C) in FIG. 4 in the mentioned order.

(1) Generation Timing in Test Pattern Generator

① Row Address (X) and Bank Address (N)

As indicated by (B) in FIG. 4, the address generator continuously generates a bank address (RBK) and a row address (Row) after a clock cycle <1>. Here, as the bank address, "RBK (0)" specifying a 0th bank of the SDRAM is generated. Additionally, as the row address, "Row (0) 0" indicative of the 0th row of the 0th bank is generated.

② Bank Address (B) and Start Column Address (Y)

Further, the address generator continuously generates a bank address (CBK) specifying a bank which stores a column address after a clock cycle <2>. Here, as the bank address, "CBK (0)" specifying the 0th bank is generated.

It is to be noted that the bank address (CBK) generated together with the start column address specifies the same bank (e.g., the 0th bank) as the bank specified by the bank address (RBK) generated together with the row address.

Furthermore, the address generator sequentially generates a start column address (Col) for each burst length in a period that the bank address "CBK (0)" is generated. Here, since the burst length is "2", every other address value is generated in accordance with each two clock cycles.

That is, as the start column address, "Col (0) 0" indicative of the 0th column (first address) of the 0th bank is generated in the cycles <2> and <3>. Subsequently, "Col (0) 2" indicative of the second column as a next first address is generated in the cycles <4> and <5>. Then, "Col (0) 4" indicative of the fourth column is generated in the cycles <6> and <7>. In this manner, the start column addresses are thereafter sequentially generated.

③ Increment Value (Z)

Moreover, the generated start column address is incremented in accordance with a clock cycle. Therefore, a value (Z) to be incremented is repeatedly generated in accordance with each cycle period corresponding to the burst length.

That is, "0" is generated as the increment of the first cycle <2> in the cycles <2> and <3> in which the 0th column is generated as the start column address, and "1" is generated as the increment in the next cycle <3>. Then "0" and "1" are thereafter alternately generated as the increment for each cycle since the burst length is "2" in this example.

(2) Input Timing to Memory Device

The row address, the row bank address, the column address and the column bank address together with commands are multiplexed and inputted to the SDRAM. That is, in addresses generated in the address generator, only an address generated at the time of inputting a command is effective in the SDRAM.

In the example indicated by (A) in FIG. 4, the row address and the bank address are inputted to the SDRAM together with a command "ACT" in the cycle <1>. Here, as the bank address, a bank address "RBK (0)" specifying the 0th bank is inputted. Additionally, as the row address, "Row (0) 0" indicative of the 0th row of the 0th bank is inputted.

It is to be noted that the command "ACT" instructs activation of a target bank of the SDRAM, and also instructs input of the row address to that bank.

Subsequently, in the cycle <2>, the start column address and the bank address are inputted to the SDRAM together with a command "READ". Here, as the bank address, a bank address "CBK (0)" specifying the 0th bank is inputted. Further, as the start column address, "Col (0)" indicative of the 0th column of the 0th bank is inputted.

This command "READ" instructs reading from a corresponding memory cell of the SDRAM. Therefore, in the cycle <2>, information in the memory cell at the 0th row (Row (0) 0) and the 0th column (Col (0) 0) of the 0th bank (BK (0)) is read.

It is to be noted that information is written in a corresponding memory cell when a command "WRITE" is inputted in place of the command "READ".

The SDRAM has a burst function with respect to the column-addresses. That is, in the memory device, the start column address is automatically incremented for each clock cycle, and the column address is then sequentially generated.

Therefore, in the cycle <3>, the start column address is incremented in the memory address, and a column address "Col (0) 1" indicative of the first column is generated. Accordingly, in the cycle <3>in the burst operation, information of a next cell is outputted as a response output from the memory address even if the command "READ" or the column address is not inputted.

In this conventional example, since the burst length is "2", the command "READ", the next start column address and the bank address "CBK (0)" are thereafter inputted every other cycle. That is, the even-numbered start column addresses "Col (0) 2", "Col (0) 4", "Col (0) 6", . . . are sequentially inputted in even-numbered cycles <4>, <6>, <8>, . . .

Therefore, in the odd-numbered cycles <3>, <5>, <7>, . . . , commands and the like are not inputted from the test pattern generator to the SDRAM at all.

(3) Input Timing to Failure Analysis Memory

① Row Address (X) and Bank Address (N)

Therefore, in the example indicated by (C) in FIG. 4, after the cycle <1>, the bank address "RBK (0)" specifying the 0th bank and the row address "Row (0) 0" indicative of the 0th row of the 0th bank are continuously inputted. These bank address and row address are the same as those generated in the command generator.

(2) Column Address (Y+Z) and bank address (B) Furthermore, after the cycle. <2>, the bank address "CBK (0)" specifying the 0th bank is continuously inputted.

Then, in each cycle after the cycle <2>, a column address obtained by adding an increment value (Z) to the start column address (Y) generated in the address generator is inputted to the failure analysis memory. That is, in the cycles <2>, <3>, <4>, . . . , the column addresses "Col (0) 0", "Col (0) 1", "Col (0) 2", . . . are sequentially inputted. As a result, the same address space as that in the SDRAM can be set in the failure analysis memory.

After the test with respect to each memory cell in the 0th bank is completed in this manner, each memory cell in the next first bank is tested. In case of testing the first bank, the test of the same timing as that of addresses and the like in the 0th bank is carried out except that an address specifying the first bank is determined as the bank address. Thereafter, the remaining banks are likewise sequentially tested in the same manner.

Meanwhile, in the memory device, a memory area is divided into a plurality of banks, and an inter-bank interleave operation to alternately perform reading/writing with respect to these banks may be performed. Carrying out the inter-bank interleave operation can increase an access speed to the memory.

When the memory device is operated in the inter-bank interleave mode, in the memory device, a row address is given in accordance with each bank in advance by the command "ACT", and reading/writing of a cell is conducted corresponding to a column address of a specified bank together with the command "READ" or "WRITE".

However, in the failure analysis memory, fail information is stored at an address corresponding to a row address and its bank of the memory device under test when a column address and its bank are specified. Therefore, in the failure analysis memory, when the column address and the bank of that column address are specified for the memory device under test, the same bank as that bank and a row address of that bank must be simultaneously specified. In the failure analysis memory, the same address space as that in the memory device under test must be set.

Therefore, in the conventional semiconductor memory test apparatus, the memory device having the burst function is hard to generate an address which is inputted to the failure analysis memory used to test the inter-bank interleave operation.

Accordingly, in view of the above-described problems, it is an object of the present invention to provide a semiconductor memory test apparatus and a failure analysis address generator by which a memory device having a burst function can readily generate an address which is inputted to a failure analysis memory used to test an inter-bank interleave operation.

DISCLOSURE OF THE INVENTION

According to the present invention, there is provided a semiconductor memory test apparatus which tests a memory device whose memory area is constituted by a plurality of banks and operates in a burst mode with respect to column addresses (or row addresses), comprising: a test pattern generator which generates a test pattern signal and an expected value pattern signal; a logic comparator which compares a response output signal of the memory device under test having the test pattern signal inputted thereto with the expected value pattern signal, and detects a mismatch as a failure cell; and a failure analysis memory which stores failure information at the same address as an address in the memory device of the failure cell; and a failure analysis address generator which generates a failure analysis address used to set in the failure analysis memory the same address space as that in the memory device in the burst mode operation. The failure analysis address generator has a register file block having a register corresponding to each bank of the memory device, holds a row address (or a column address) of a corresponding bank in each register, reads a row address (or a column address) of the same bank as a start column address (or a start row address) from a register corresponding to any bank when the start column address (or the start row address) of that bank is inputted to the memory device, outputs it to the failure analysis memory together with the start column address (or the start row address), and outputs to the failure analysis memory the row address (or the column address) together with the same column address (or row address) as that in the memory device generated by calculating the start column address (or the start row address) in accordance with each clock cycle.

According to the present invention, the row address (or the column address) held in the register can be inputted to the failure analysis memory with an arbitrary timing in a period of holding that row address without being restricted to a generation timing of that row address. As a result, the same address space as that in the memory device which is performing the inter-bank interleave operation in the burst mode can be readily set in the failure analysis memory.

BEST MODE FOR CARRYING OUT THE INVENTION

In order to explain the present invention in further detail, an embodiment of a semiconductor test apparatus and a failure analysis address generator according to the present invention will now be described hereinafter with reference to the accompanying drawings.

Figure 1:
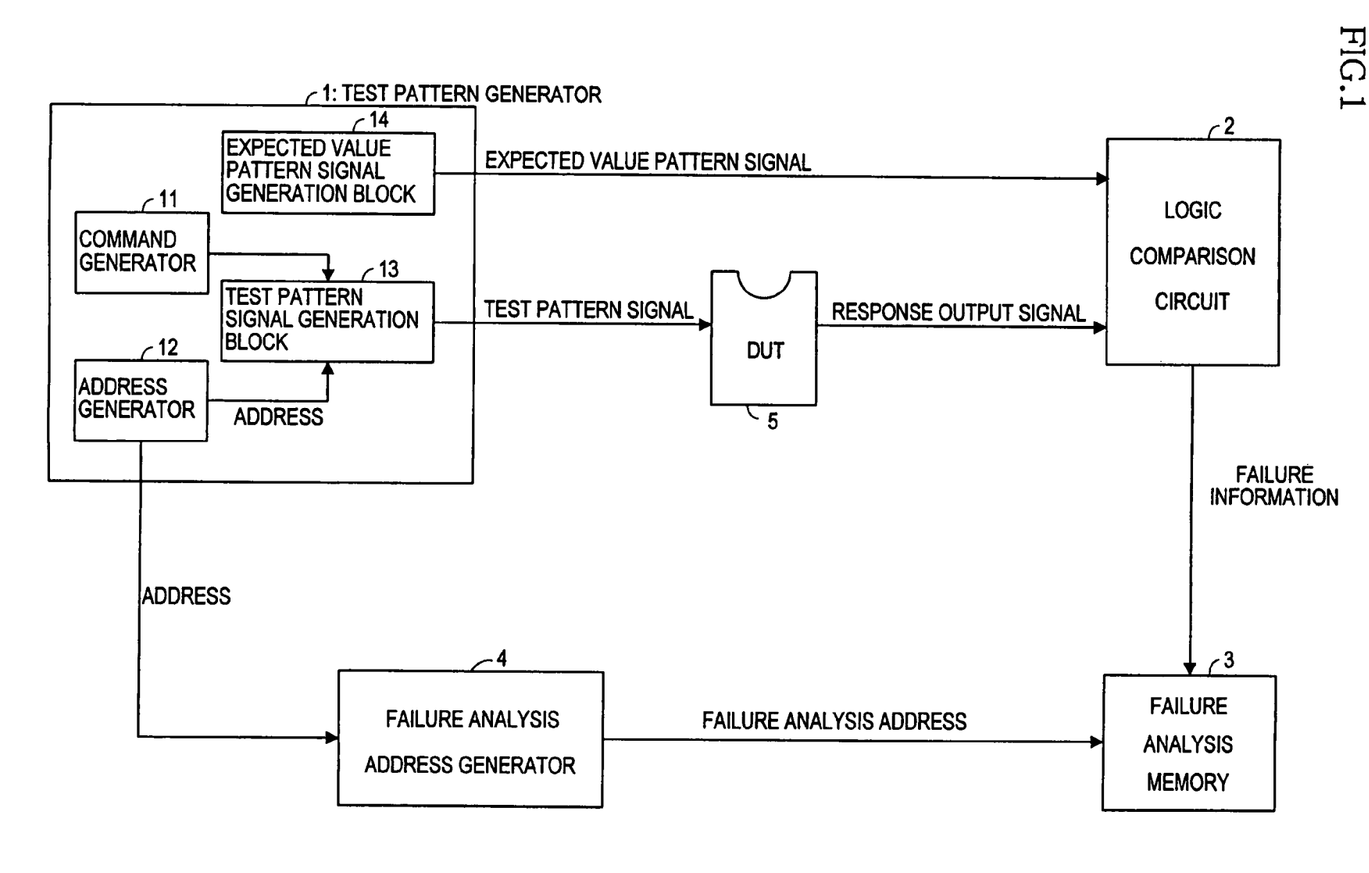
FIG. 1 is a block diagram illustrating an outline of a preferred embodiment of a semiconductor memory test apparatus according to the present invention.
Figure 2:
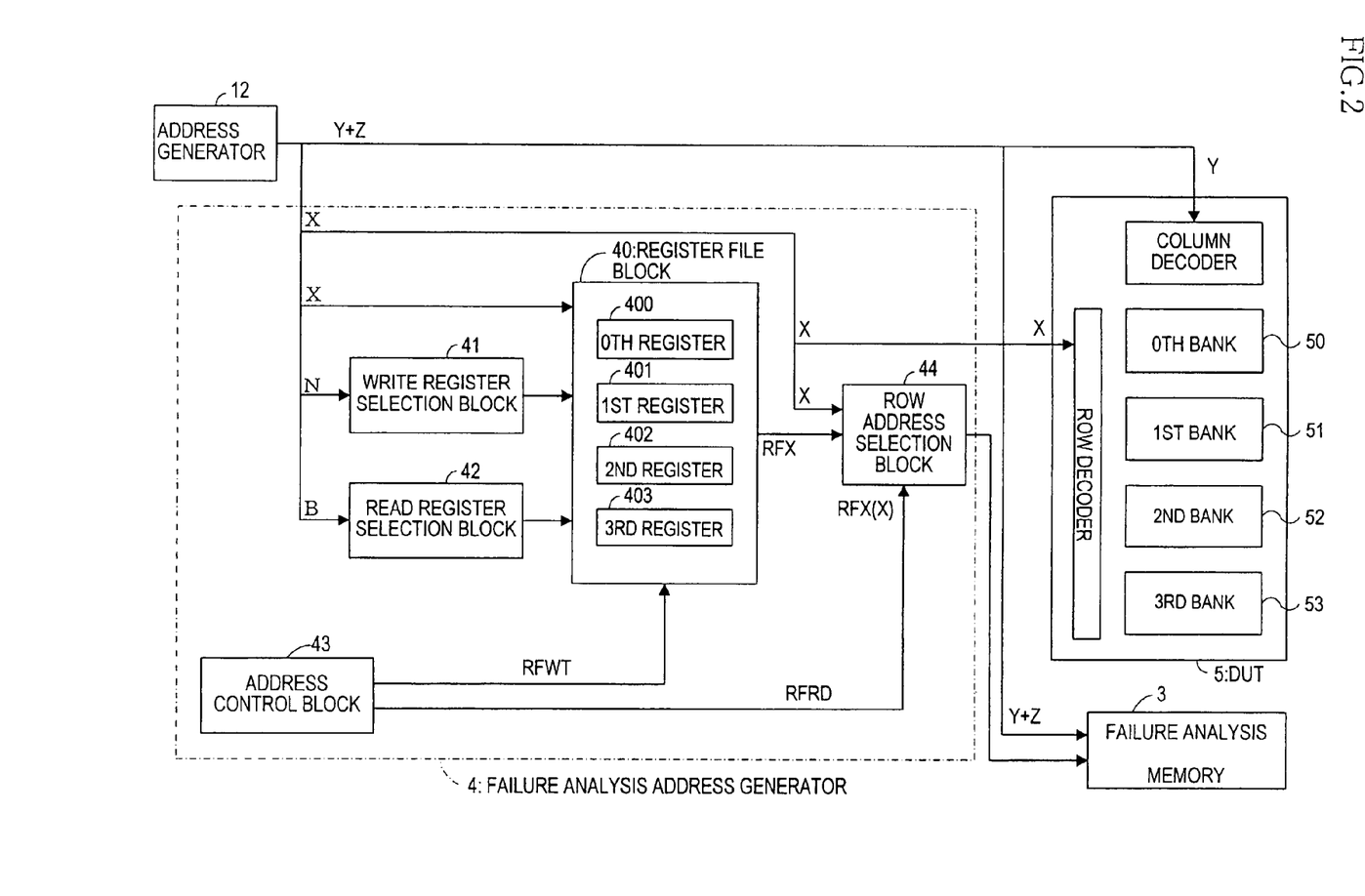
FIG. 2 is a block diagram illustrating a structure of the preferred embodiment of the semiconductor memory test apparatus and a failure analysis address generator according to the present invention.

1. Structure

First, a description will be given as to a structure of the semiconductor memory test apparatus and the failure analysis memory generator according to the embodiment with reference to FIGS. 1 and 2.

In this embodiment, as a memory device 5, an SDRAM is evaluated as a device under test. This SDRAM has a memory area constituted by four banks, and performs a burst mode operation with a burst length of "2" with respect to column addresses.

As shown in FIG. 1, the semiconductor memory test apparatus according to this embodiment includes a test pattern generator 1, a logic comparison circuit 2, a failure analysis memory 3, and a failure analysis address generator 4.

It is to be noted that illustrations and explanations of a timing generator, a delay circuit, a pin electronics and the like included in a regular semiconductor memory test apparatus are omitted in this embodiment.

The test pattern generator 1 generates a test pattern signal and an expected pattern signal. Therefore, the test pattern generator 1 is constituted by a command generator 11, an address generator 12, a test pattern signal generation block 13, and an expected value pattern signal generation block 14.

The command generator 11 generates a command "ACT" and a command "READ" or "WRITE". The command "ACT" is generated every two cycle periods corresponding to the burst length. Further, the command "READ" or "WRITE" is generated every two cycle periods corresponding to the burst length in a cycle that the command "ACT" is not generated.

The address generator 12 sequentially generates a bank address (N) and a row address X every two cycle periods corresponding to the burst length of the memory device with respect to each bank.

It is to be noted that the bank address (N) specifies any bank in the four banks of the memory device 5, and the row address (X) is indicative of a row address in the specified bank.

Furthermore, the address generator 12 sequentially generates a bank address (B) and a start column address Y every two cycle periods corresponding to the burst length with respect to each bank.

It is to be noted that the bank address (B) specifies any one in the four banks of the memory device 5. Moreover, the bank specified by this bank address (B) may be any bank whose bank address (N) is specified.

Additionally, the start column address is a top column address of the burst and takes a non-continuous value for each burst length. Here, since the burst length is "2", the start column address is every other value.

Further, the address generator 12 generates a column address by incrementing a start column address for each clock cycle in the burst operation of the bank. Here, every time the start column address is generated, an increment value Z which is increased for each clock cycle is generated, and a column address (Y+Z) obtained by adding the increment value Z to the start column address (Y) is generated.

As a result, the column address corresponding to the column address automatically generated in the memory device 5 in the burst operation can be generated. Here, since the burst length is "2", the column address obtained by incrementing the start column address by "+1" is generated in a next clock cycle after the start column address is produced.

It is to be noted that the increment processing may be carried out outside the address generator 12.

Furthermore, the test pattern signal generation block 13 generates test pattern signal by combining a command issued in the command generator 11 with an address produced in the address generator 12.

That is, when the command "ACT" is generated, the test pattern signal generation block 13 combines that command with the row address (X), and outputs a result to the memory device 5. Moreover, when the command "READ" or "WRITE" is generated, the test pattern signal generation block 13 combines that command with the start column address, and outputs a result to the memory device 5.

Additionally, the test pattern signal is inputted to the memory device 5 as a device under test (DUT). Further, an expected value pattern signal generated in the expected value pattern signal generation block 14 is inputted to the logic comparison circuit 2.

Furthermore, the logic comparison circuit 2 compares a response output signal of the memory device 5 having the test pattern signal inputted thereto with the expected value pattern signal. Moreover, it detects a result of mismatch as a failure cell. When the failure cell is detected, failure information is supplied to the failure analysis memory 3.

The failure analysis memory 3 stores the failure information at the same address as an address in the memory device of the failure cell.

Additionally, the failure analysis address generator 4 generates a failure analysis address to set in the failure analysis memory the same address space as that in the memory device 5 which is performing the burst mode operation.

Therefore, the failure analysis address generator 4 provides a register corresponding to each bank of the memory device, and holds the row address of a corresponding bank in each register. Further, when the start column address (Y) of any bank is inputted to the memory device 5, the row address of the same bank as that of the start column address (Y) is read from the register corresponding to that bank. Subsequently, the read row address is outputted to the failure analysis memory 3 together with the start column address.

Furthermore, in the burst operation of the bank, the column address is generated by operating that start column address for each clock cycle, and that row address is outputted to the failure analysis memory 3 together with the generated column address.

A structure of the failure analysis address generator 4 will now be described in detail with reference to FIG. 2.

It is to be noted that FIG. 2 shows only the address generator 12 in the test pattern generator 1 depicted in FIG. 1 and omits any other constituent element. Moreover, the illustration of the logic comparison circuit 2 in FIG. 1 is also omitted.

The failure analysis address generator 4 is constituted by a register file block 40, a write register selection block 41, a read register selection block 42, an address control block 43 and a row address selection block 44.

The write register selection block 41 selects a register of the register file block 40 in which a row address (X) is written in accordance with a bank address (N) outputted together with the row address (X).

Additionally, the read register selection portion 42 selects a register used to read a row address REX stored in the register file block 40 in accordance with a bank address (B) outputted together with a column address (Y+Z).

Further, the address control block 43 generates a write instruction signal (RFWT) when the row address (X) of any bank is inputted from the test pattern generator 1 to the memory device 5. Furthermore, when a start column address (Y) of any bank is inputted to the memory device 5, the address control block 43 generates a read instruction signal (RFRD) in the burst operation of the bank having the start address (Y) inputted thereto.

Moreover, the register file block 40 has 0th to third registers 400 to 403 respectively corresponding to 0th to third banks 50 to 53 of the memory device. Additionally, when the write instruction signal (RFWT) is generated from the address control block 43, the register file block 40 writes the row address in a register selected by the write register selection block 41.

When the read instruction signal (RFRD) is generated from the address control block 43, the row address selection block 44 reads the row address from a register selected by the read register selection block 42, and outputs it to the failure analysis memory. Further, when the read instruction signal (RFRD) is not generated, the row address selection block 44 outputs the row address (X) generated in the address generator 12 to the failure analysis memory as it is.

It is to be noted that the column address (Y+Z) generated in the address generator 12 is inputted to the failure analysis memory 3 as it is.

2. Operation

An operation of the semiconductor memory test apparatus according to the embodiment will now be described with reference to a timing chart of FIG. 3.

Here, there is illustrated an example of an address generation timing when testing the SDRAM which has four banks, operates in the burst mode with respect to column addresses and has the burst length of "2".

Figure 3:
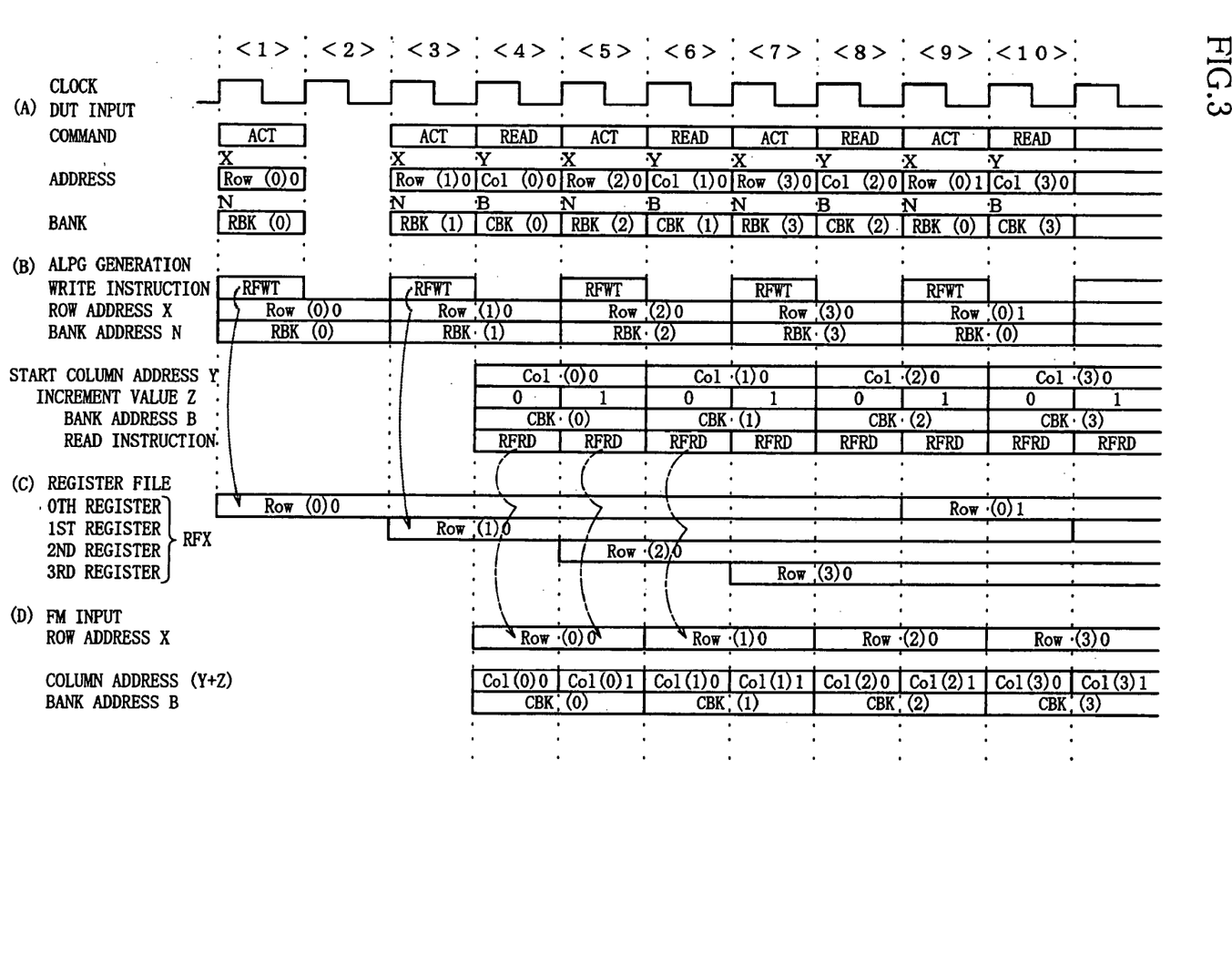
FIG. 3 is a timing chart illustrating an operation of the preferred embodiment of the semiconductor memory test apparatus and the failure analysis address generator according to the present invention.

(A) in FIG. 3 indicates input timings of a command, an address and a bank address to the memory device as a device under test (DUT). Furthermore, (B) in FIG. 3 indicates generation timings of a row address, a start column address, an increment value and a bank address in the address generator of the test pattern generator (ALPG). Moreover, (B) in FIG. 3 also indicates generation timings of a write instruction signal (RFWT) and a read instruction signal (RFRD).

Additionally, (C) in FIG. 3 indicates a timing that a row address is stored and held in each register of the register file block 40. Further, (D) in FIG. 3 indicates input timings of a row address and a column address as failure analysis addresses to the failure analysis memory (FM).

A description will now be given as to (1) generation timings of addresses and the like in the test pattern generator indicated by (B) in FIG. 3, (2) input timings of addresses and the like to the memory device indicated by (A) in FIG. 3, (3) storage timings or the like of a row address in the register file block indicated by (C) in FIG. 3, (4) input timings of addresses and the like to the failure analysis memory indicated by (D) in FIG. 3, and (5) the operation for each cycle in the mentioned order.

(1) Generation Timing in Test Pattern Generator

① Row address (X) and bank address (N)

As indicated by (B) in FIG. 3, the address generator 12 sequentially generates a bank address (N) and a row address (X) with respect to each bank in accordance with each cycle period corresponding to the burst length of the memory device. Here, since the burst length is "2", the bank address (N) and the row address (X) are generated every two clock cycles.

That is, as indicated by (B) in FIG. 3, in the cycles <1> and <2>, the bank address "RBK (0)" specifying the 0th bank is generated together with the row address "Row (0) 0" indicative of the 0th row of the 0th bank. Subsequently, in the cycles <3> and <4>, the bank address "RBK (1)" specifying the first bank is generated together with the row address "Row (1) 0" indicative of the 0th row of the first bank.

Thereafter, the bank addresses and the row addresses with respect to the second bank and the third bank are generated every two cycles in the similar manner. Further, after all the banks are specified, a pattern to sequentially specify from the 0th bank is again repeated. At that time, values of the row addresses are sequentially calculated every time all of the respective banks are specified.

For example, as indicated by (B) in FIG. 3, in the cycles <9> and <10>, the bank address "RBK (0)" specifying the 0th bank is generated together with "Row (0) 1" indicative of the first row of the 0th bank. Likewise, although not shown, the bank address "RBK (0)" specifying the 0th bank is generated together with "Row (0) 2" indicative of the second row of the 0th bank in the cycles <17> and <18>.

② Bank Address (B) and Start Column Address (Y)

The address generator 12 sequentially generates the bank address (B) and the start column address (Y) with respect to each bank in accordance with each cycle period corresponding to the burst length in the clock cycle <4> and subsequent clock cycles. Here, since the burst length is "2", the bank-address and every other start column address value are generated every two clock cycles.

That is, as indicated by (B) in FIG. 3, in the cycles <4> and <5>, the bank address "CBK (0)" specifying the 0th bank is generated together with the column address "Col (0) 0" indicative of the 0th column of the 0th bank. Subsequently, in the cycles <6> and <7>, the bank address "CBK (1)" specifying the first bank is generated together with the column address "Col (1) 0" indicative of the 0th column of the first bank.

Thereafter, the bank address (B) and the column address (X) are outputted with respect to the second bank and the third bank every two cycles in the similar manner. At that time, since the burst length is "2", every two column address values are calculated.

For example, although not shown, in the cycles <12> and <13>, the bank address "CBK (0)" specifying the 0th bank is generated together with "Col (0) 2" indicative of the second column of the 0th bank. Further, in the cycles <20> and <21>, the bank address "CBK (0)" specifying the 0th bank is generated together with "Col (0) 4" indicative of the fourth column of the 0th bank.

③ Increment Value (Z)

Furthermore, the generated start column address is calculated in accordance with each clock cycle. For the purpose, the value (Z) used in calculation is repeatedly generated in accordance with each cycle period corresponding to the burst length.

It is to be noted that the increment value (Z) may be generated in the address generator 12 or it may be generated outside the address generator 12.

That is, as indicated by (B) in FIG. 3, in the cycles <4> and <5> in which the 0th column is generated as the start column address, "0" is generated as an increment value of the first cycle <4>, and "1" is generated as an increment value in the next cycle <5>. Thereafter, since the burst length is "2", "0" and "1" are alternately generated as increment values in the similar manner.

(2) Input Timing to Memory Device

① Command "ACT" and Row Address (X)

To the memory device 5 are inputted an address multiplexed with a command by the test pattern signal generation block 13 and a bank address. That is, of addresses generated in the address generator, only an address generated at the time of inputting a command is effective in the memory device 5 as a test pattern signal.

The command generator 11 generates a command "ACT" with an arbitrary cycle in a cycle that a command "READ" or "WRITE" is not generated. Here, since the burst length is "2", the command "ACT" is generated every other cycle in the odd-numbered cycles <1>, <3>, <5>, . . .

Moreover, the test pattern signal generation block 13 inputs the row address (X) and the bank address (N) generated in the address generator 12 at the time of generation of the command "ACT" to the memory device 5 together with the command "ACT".

Therefore, the bank address and the row address arbitrarily specified with respect to each bank are inputted together with the command "ACT" every other cycle.

For example, as indicated by (A) in FIG. 3, in the cycle <1>, the bank address "RBK (0)" specifying the 0th bank and "Row (0) 0" indicative of the 0th row of the 0th bank are inputted together with the command "ACT". Additionally, in the cycle <3>, the bank address "RBK (1)" specifying the first bank and "Row (1) 0" indicative of the 0th row of the first bank are inputted together with the command "ACT". Further, in the cycle <5>, the bank address "RBK (2)" specifying the second bank and "Row (2) 0" indicative of the 0th row of the second bank are inputted together with the command "ACT".

② Command "READ" and Start Column Address (Y)

Furthermore, in a cycle that the command "ACT" is not generated, the command generator 11 generates the command "READ" or "WRITE" in accordance with each cycle period corresponding to the burst length. In this embodiment, since the burst length is "2", the command "READ" is generated every other cycle in the even-numbered cycles 4>, <6>, <8>, . . .

It is to be noted that a description will be given as to an example of inputting the command "READ" in this embodiment, but the command "WRITE" may be inputted with the similar timing.

Moreover, the test pattern signal generation block 13 inputs the start column address (Y) and the bank address (B) generated in the address generator 12 at the time of generation of the command "READ" to the memory device 5 together with the command "READ".

It is to be noted that this command "READ" is generated in a top cycle that the start column address (Y) is generated in the address generator 12.

Therefore, the bank address and the start column address specified with respect to each bank are inputted together with the command "READ" every other cycle.

For example, as indicated by (A) in FIG. 3, in the cycle <4>, the bank address "CBK (0)" specifying the 0th bank and "Col (0) 0" indicative of the 0th column of the 0th bank are inputted together with the command "READ". Additionally, in the cycle <6>, the bank address "CBK (1)" specifying the first bank and "Col (1) 0" indicative of the 0th column of the first bank are inputted together with the command "READ". Further, in the cycle <8>, the bank address "CBK (2)" specifying the second bank and "Col (2) 0" indicative of the 0th column of the second bank are inputted together with the command "READ".

By alternately inputting the command "ACT" and the command "READ" with such timings, a row address of another bank can be inputted to the memory device when one bank of the memory device is performing the burst operation.

(3) Storage Timing and Others of Row Address in Register File Block

The register file block 40 writes the row address (X) in a register selected by the write register selection block when a write instruction signal "RFWT" is generated. That is, when the row address (X) of any bank is inputted from the test pattern generator to the memory device 5 together with the command "ACT", the register file block 40 stores that row address (X) in a register corresponding to that bank.

For example, as indicated by (C) in FIG. 3, in the cycle <1>, the row address "Row (0) 0" indicative of the 0th row of the 0th bank is stored in a 0th register 400. Furthermore, in the cycle <3>, "Row (1) 0" indicative of the 0th row of the first bank is stored in a first register 401. Moreover, in the cycle <5>, "Row (2) 0" indicative of the 0th row of the second bank is stored in a second register 402. Additionally, in the cycle <7>, "Row (3) 0" indicative of the 0th row of the third bank is stored in a third register 403.

Further, in the cycle <9>, the row address "Row (0) 1" indicative of the first row of the 0th bank is stored in the 0th register 400. That is, each register holds the row address until immediately before the next row address is stored.

(4) Input Timing to Failure Analysis Memory

① Row Address (X)

When a read instruction signal "RFRD" is generated, a row address selection block 44 reads a row address from a register selected by a read register selection block 42, and inputs it to the failure analysis memory 3. At the time of inputting the start column address (Y) of any bank to the memory device 5, the read instruction signal "RFRD" is generated by an address control block 43 when that bank is performing the burst operation. Therefore, in a period that the start column address (Y) is generated, a row address (RFX) held in a register corresponding to the bank at that start column address is read.

For example, as indicated by (D) in FIG. 3, in the cycles <4> and <5>, the row address "Row (0) 0" held in the 0th register 400 is inputted to the failure analysis memory 3. In the cycles <6> and <7>, the row address "Row (1) 0" held in the first register 401 is inputted to the failure analysis memory 3. In the cycles <8> and <9>, the row address "Row (2) 0" held in the second register 402 is inputted to the failure analysis memory 3.

② Column Address (Y+Z) and Bank Address (B)

In this embodiment, the column address (Y+Z) and the bank address (B) generated in the address generator 12 are inputted to the failure analysis memory 3 as they are.

Furthermore, an address in the failure analysis memory 3 is specified by a combination of the bank address, the row address and the column address inputted to the failure analysis memory 3.

(5) Operation for Each Cycle

The operation illustrated in the timing chart of FIG. 3 will now be described in accordance with each cycle.

Cycle <1>

In the cycle <1>, the row address "Row (0) 0" and the bank address "RBK (0)" generated in the address generator 12 are inputted to the memory device 5 together with the command "ACT".

Moreover, the row address "Row (0) 0" is written in the 0th register 400 of a register file 40 by the write instruction signal "RFWT".

Cycle <3>

In the cycle <3>, the row address "Row (1) 0" and the bank address "RBK (1)" generated in the address generator 12 are inputted to the memory device 5 together with the command "ACT".

Additionally, the row address "Row (1) 0" is written in the first register 401 by the write instruction signal "RFWT".

Cycle <4>

In the cycle <4>, the start column address "Col (0) 0" and the bank address "CBK (0)" generated in the address generator 12 are inputted to the memory device 5 together with the command "READ".

Further, based on the read instruction signal "RFRD", the row address "Row (0) 0" held in the 0th register 400 is read and inputted to the failure analysis memory 3. Further, the column address "Col (0) 0" generated in the address generator 12 is also inputted to the failure analysis memory 3. As a result, a memory cell at the row address "Row (0) 0" and the column address "Col (0) 0" of the 0th bank is specified.

Cycle <5>

In the cycle <5>, the row address "Row (2) 0" and the bank address "RBK (2)" generated in the address generator 12 are inputted to the memory device 5 together with the command "ACT".

It is to be noted that the column address "Col (0) 1" following the start column address "Col (0) 0" is automatically generated by the burst function in the memory device 5.

Furthermore, in the cycle <5>, based on the write instruction signal "RFWT", the row address "Row (2) 0" is written in the second register 402.

Moreover, based on the read instruction signal "RFRD", the row address "Row (0) 0" held in the 0th register 400 is again read and inputted to the failure analysis memory 3. Additionally, the column address "Col (0) 1" generated in the address generator 12 is also inputted to the failure analysis memory 3. As a result, a memory cell at the row address "Row (0) 0" and the column address "Col (0) 1" of the 0th bank is specified.

In the cycle <6>, the start column address "Col (1) 0" and the bank address "CBK (1)" generated in the address generator 12 are inputted to the memory device 5 together with the command "READ".

Further, based on the read instruction signal "RFRD", the row address "Row (1) 0" held in the first register 401 is read and inputted to the failure analysis memory 3. Furthermore, the column address "Col (1) 0" generated in the address generator 12 is also inputted to the failure analysis memory 3. As a result, a memory cell at the row address "Row (1) 0" and the column address "Col (1) 0" of the first bank is specified.

Cycle <7>

In the cycle <7>, the row address "Row (3) 0" and the bank address "RBK (3)" generated in the address generator 12 are inputted to the memory device 5 together with the command "ACT".

It is to be noted that the column address "Col (1) 1" following the start column address "Col (1) 0" is automatically generated by the burst function in the memory device 5.

Moreover, in the cycle <7>, based on the write instruction signal "RFWT", the row address "Row (3) 0" is written in the third register 403.

Further, based on the read instruction signal "RFRD", the row address "Row (1) 0" held in the first register 401 is again read and inputted to the failure analysis memory 3. Furthermore, the column address "Col (1) 1" generated in the address generator 12 is also inputted to the failure analysis memory 3. As a result, a memory cell at the row address "Row (1) 0" and the column address "Col (1) 1" of the first bank is specified.

Cycle <8>

In the cycle <8>, the start column address "Col (2) 0" and the bank address "CBK (2)" generated in the address generator 12 are inputted to the memory device 5 together with the command "READ".

Additionally, based on the read instruction signal "RFRD", the row address "Row (2) 0" held in the second register 402 is read and inputted to the failure analysis memory 3. Further, the column address "Col (2) 0" generated in the address generator 12 is also inputted to the failure analysis memory 3. As a result, a memory cell at the row address "Row (2) 0" and the column address "Col (2) 0" of the second bank is specified.

Cycle <9>

In the cycle <9>, the row address "Row (0) 1" and the bank address "RBK (0)" generated in the address generator 12 are inputted to the memory device 5 together with the command "ACT".

Furthermore, the column address "Col (2) 1" following the start column address "Col (2) 0" is automatically generated by the burst function in the memory device 5.

Moreover, in the cycle <9>, based on the write instruction signal "RFWT", the row address "Row (0) 1" is written in the 0th register 400.

Additionally, based on the read instruction signal "RFRD", the row address "Row (2) 0" held in the second register 401 is again read and inputted to the failure analysis memory 3. Further, the column address "Col (2) 1" generated in the address generator 12 is also inputted to the failure analysis memory 3. As a result, a memory cell at the row address "Row (2) 0" and the column address "Col (2) 1" of the second bank is specified.

Cycle <10>

In the cycle <10>, the start column address "Col (3) 0" and the bank address "CBK (3)" generated in the address generator 12 are inputted to the memory device 5 together with the command "READ".

On the other hand, based on the read instruction signal "RFRD", the row address "Row (3) 0" held in the third register 403 is read and inputted to the failure analysis memory 3. Furthermore, the column address "Col (3) 0" generated in the address generator 12 is also inputted to the failure analysis memory 3. As a result, a memory cell at the row address "Row (3) 0" and the column address "Col (3) 0" of the third bank is specified.

Thereafter, in each of the subsequent cycles, the failure analysis addresses are inputted to the failure analysis memory 3 in the similar manner.

As described above, in this embodiment, the row address (RFX) held in the register is inputted to the failure analysis memory 3. Therefore, that row address can be inputted to the failure analysis memory 3 with an arbitrary timing in a period of holding that tow address without being restricted to a generation timing of that row address.

As a result, the same address space as that in the memory device performing the inter-bank interleave operation in the burst mode can be readily set in the failure analysis memory.

It is to be noted that the description has been given as to the example that the present invention is constituted under specific conditions in the foregoing embodiment, but the present invention can be modified in many ways. For example, the description has been given as to the example that the burst length is "2" in the above embodiment, but the burst length is not restricted thereto in the present invention. For example, the burst length may be determined as "4" or "8".

Moreover, although the command "ACT" is generated every other cycle in the foregoing embodiment, a generation interval of the command "ACT" is not restricted thereto in the present invention.

Additionally, although the description has been given on the example that the failure analysis address generator is provided outside the test pattern generator in the above embodiment, a part or all of the failure analysts address generator may be included in the test pattern generator.

Further, although the description has been given as to the case that the memory device operates with respect to the column address in the burst mode in the foregoing embodiment, the memory device may operate with respect to the row address in the burst mode. In such a case, the column address (start column address) described in the above embodiment serves as the row address (start row address), and the row address functions as the column address. Furthermore, the above-described row address selection block 44 becomes a column address selection block.

As described above, the semiconductor memory test apparatus according to the present invention can input an address (row address) held in a register to the failure analysis memory, and that row address can be inputted to the failure analysis memory with an arbitrary timing in a period of holding that row address without being restricted to a generation timing of that row address.

Therefore, the present invention is suitable for using the failure analysis memory which stores a test result of the memory device which operates in the burst mode and is performing the inter-bank interleave operation.

The invention claimed is:

1. A semiconductor memory test apparatus which tests a memory device comprising:
    a test pattern generator which generates a test pattern signal and an expected value pattern signal; the test pattern signal being applied to the memory device whose memory area is constituted by a plurality of banks where addresses to the banks are generated automatically in a burst mode operation upon receiving a start column or start row address from the semiconductor memory test apparatus;
    a logic comparator which compares a response output signal of the memory device with the expected value pattern signal, and detects a result of a mismatch as a failure of a cell;
    a failure analysis memory which stores failure information at the same address as an address of the failure cell in the memory device;
    a failure analysis address generator which generates a failure analysis address which sets in the failure analysis memory the same address space as that in the memory device which is in the burst mode operation; and
    a register file block provided in the failure analysis address generator, the register file block having a plurality of registers corresponding to the respective banks of the memory device;
    wherein each register in the register file block corresponding to the bank outputs the row or column address to the failure analysis memory which is the same column or row address as that automatically generated in the memory device after the start column or start row address at each clock cycle in the burst mode operation of the bank.

2. The semiconductor memory test apparatus according to claim 1, wherein the register file block holds a row or column address of a corresponding bank in each register,
    reads a row or column address of the same bank as a start column or a start row address of a bank and outputs it to the failure analysis memory together with the start column or the start row address when the start column or start row address is inputted to the memory device, and
    outputs the row or column address to the failure analysis memory together with the same column or row address as that in the memory device generated by operating the start column or start row address in accordance with each clock cycle in the burst operation of the bank.

3. The semiconductor memory test apparatus according to claim 1, wherein, when a row or column address of a bank is inputted from the test pattern generator to the memory device, the failure analysis address generator stores the row or column address in the register corresponding to that bank.

4. The semiconductor memory test apparatus according to claim 1, wherein the failure analysis address generator holds in each register a row or column address until immediately before a next row or column address is stored.

5. The semiconductor memory test apparatus according to claim 1, wherein, in the burst operation of one bank of the memory device, the test pattern generator inputs a row or column address of another bank to the memory device.

6. The semiconductor memory test apparatus according to any of claim 1, wherein the test pattern generator comprises:

a command generator which arbitrarily generates a command "ACT", and generates a command "READ" or "WRITE" in a cycle that the command "ACT" is not generated;

an address generator which generates a bank address specifying a bank and a row or column address of that bank in a cycle period corresponding to a burst length of the memory device, generates a bank address and a start column or start row address in that bank in the cycle period corresponding to the burst length, and generates a column or row address by operating the start column or start row address in accordance with each clock cycle in the burst operation of that bank; and a test pattern signal generation block which combines the command "ACT" with the row or column address generated by the address generator at the time of generation of the command "ACT" and outputs a result to the memory device, and combines the command "READ" or "WRITE" with the start column or start row address generated by the address generator at the time of generation of the command "READ" or "WRITE" and outputs a result to the memory device.

7. The semiconductor memory test apparatus according to any of claim 1, wherein the failure analysis address generator comprises:

a write register selection block which selects a register in which the row or column address is written in accordance with a bank address which is outputted together with the row or column address and specifies any one of the banks; and a read register selection block which selects a register from which the row or column address is read in accordance with a bank address outputted together with the row or column address.

8. The semiconductor memory test apparatus according to claim 7, wherein the failure analysis address generator has:

an address control block which generates a write instruction signal when a row or column address of a bank is inputted from the test pattern generator to the memory device, and generates a read instruction signal when a start column or start row address of a bank is inputted to the memory device and that bank is performing the burst mode operation: and a row or column address selection block which reads a row or column address from a register selected by the read register selection block and outputs it to the failure analysis memory, wherein the register file block writes a row or column address in a register selected by the write register selection block when the write instruction signal is generated.

9. The semiconductor memory test apparatus according to claim 8, wherein the row or column address selection block outputs a row or column address generated in the address generator to the failure analysis memory when the read instruction signal is not generated.

10. The semiconductor memory test apparatus according to claim 1, wherein the memory device is a synchronous DRAM.

11. A method for address generation for failure analysis which generates a failure analysis address for a failure analysis memory in a semiconductor memory test apparatus which tests a memory device whose memory area is constituted by a plurality of banks and which performs a burst mode operation, the method comprising the following steps of:

holding a row or column address of a corresponding bank in each register of a register file block having registers corresponding to the respective banks of the memory device;

reading a row or column address of the same bank as a start column or start row address of a bank from a register corresponding to the bank;

outputting the row or column address to the failure analysis memory together with the start column or start row address when the start column or start row address is inputted to the memory device; and outputting the row or column address to the failure analysis memory together with the same column or row address as that in the memory device generated by operating the start column or start row address in accordance with each clock cycle in the burst operation of the bank.

* * * * *